US008476587B2

(12) United States Patent
Jones et al.

(10) Patent No.: US 8,476,587 B2
(45) Date of Patent: Jul. 2, 2013

(54) ION SOURCE WITH SURFACE COATING

(75) Inventors: Gordon A. Jones, Lancashire (GB); David S. Douce, Cheshire (GB); Amir Farooq, Oldham (GB)

(73) Assignee: Micromass UK Limited, Manchester (GB)

( * ) Notice: Subject to any disclaimer, the term of this patent is extended or adjusted under 35 U.S.C. 154(b) by 48 days.

(21) Appl. No.: 13/294,715

(22) Filed: Nov. 11, 2011

(65) Prior Publication Data

US 2012/0286152 A1 Nov. 15, 2012

Related U.S. Application Data

(63) Continuation-in-part of application No. PCT/GB2010/000968, filed on May 13, 2010, and a continuation-in-part of application No. PCT/GB2010/000958, filed on May 13, 2010, and a continuation-in-part of application No. PCT/GB2010/000964, filed on May 13, 2010, and a continuation-in-part of application No. PCT/GB2010/000966, filed on May 13, 2010.

(60) Provisional application No. 61/181,386, filed on May 27, 2009, provisional application No. 61/181,418, filed on May 27, 2009, provisional application No. 61/181,415, filed on May 27, 2009, provisional application No. 61/181,428, filed on May 27, 2009.

(51) Int. Cl.
*H01J 49/10* (2006.01)
*H01J 49/26* (2006.01)
*C23C 14/14* (2006.01)
*C23C 14/16* (2006.01)
*C23C 16/50* (2006.01)

(52) U.S. Cl.
USPC ............. 250/288; 250/281; 250/282; 427/61; 427/523; 427/569; 427/580; 427/597; 204/192.15; 204/192.11

(58) Field of Classification Search
USPC .................... 250/288, 281, 282; 427/61, 523, 427/569, 580, 597; 204/192.15, 192.11
See application file for complete search history.

(56) References Cited

U.S. PATENT DOCUMENTS 3,356,843 A 12/1967 Mcelligot
5,150,010 A 9/1992 Kageyama (Continued)

FOREIGN PATENT DOCUMENTS

| | | |
|---|---|---|
| GB | 2099216 | 5/1982 |
| JP | 1255140 | 10/1989 |
| JP | 2004186113 | 7/2004 |
| KR | 20090015392 | 2/2009 |

OTHER PUBLICATIONS

Deutchman et al., "*Industrial Diamond and Diamondlike Films*" Coatings Technology Handbook. pp. 33-1-pp. 33-6, pp. 33-3-pp. 33-5, 2005.

(Continued)

*Primary Examiner* — Nikita Wells
(74) *Attorney, Agent, or Firm* — Diederiks & Whitelaw, PLC

(57) ABSTRACT

A mass spectrometer includes an Electron Impact ("EI") or a Chemical Ionisation ("CI") ion source, and the ion source includes a first coating or surface. The first coating or surface is formed of a metallic carbide, a metallic boride, a ceramic or DLC, or an ion-implanted transition metal.

22 Claims, 5 Drawing Sheets

U.S. PATENT DOCUMENTS

| | | | |
|---|---|---|---|
| 5,340,983 | A | 8/1994 | Deinzer et al. |
| 5,656,820 | A | 8/1997 | Murakoshi et al. |
| 5,698,035 | A | 12/1997 | Matsudo et al. |
| 6,608,318 | B1 | 8/2003 | Perkins et al. |
| 6,625,546 | B2 * | 9/2003 | Sepetov et al. .................. 506/8 |
| 6,683,317 | B1 | 1/2004 | Simmons et al. |
| 7,385,210 | B2 | 6/2008 | Ulrich et al. |
| 2001/0037817 | A1 | 11/2001 | Abbott |
| 2003/0146378 | A1 | 8/2003 | Mordehai |
| 2004/0089802 | A1 | 5/2004 | Kato |
| 2005/0194530 | A1 | 9/2005 | Thakur |
| 2005/0211911 | A1 | 9/2005 | Fischer et al. |
| 2006/0097645 | A1 | 5/2006 | Horsky |
| 2007/0170372 | A1 | 7/2007 | Horsky |
| 2008/0054171 | A1 | 3/2008 | Bonn et al. |
| 2008/0073505 | A1 | 3/2008 | Niu et al. |
| 2008/0223409 | A1 | 9/2008 | Horskey et al. |
| 2010/0065754 | A1 | 3/2010 | Bromberg et al. |
| 2011/0260075 | A1 | 10/2011 | Bromberg et al. |
| 2011/0291005 | A1 | 12/2011 | Wueest et al. |
| 2012/0292500 | A1 * | 11/2012 | Jones et al. .................. 250/288 |

OTHER PUBLICATIONS

Sugizaki et al. "*Improvement of Corrosion Resistance of Titanium by Co-Implantation*" Surface and Coatings Technology, vol. 83. pp. 167-174, 1996.

* cited by examiner 2, 4 dinitrophenol. $C_6 H_4 N_2 O_5$ 4 amino biphenyl, $C_{12} H_{11} N$ Phenobarbital, $C_{12} H_{12} N_2 O_3$

| Compound | % increase initial | S : N (RMS) | Signal | Noise amplitude | Area |
|---|---|---|---|---|---|
| 2,4 dinitrophenol | TiC | 2.04 | 3.14 | 1.46 | 3.60 |
| 2,4 dinitrophenol | Cleaned stainless steel | 0.60 | 1.62 | 2.66 | 1.87 |
| 4 amino biphenyl | TiC | 1.27 | 1.59 | 1.14 | 1.55 |
| 4 amino biphenyl | Cleaned stainless steel | 1.90 | 3.31 | 1.73 | 2.84 |
| Phenobarbital | TiC | 1.74 | 2.55 | 1.52 | 2.99 |
| Phenobarbital | Cleaned stainless steel | 0.60 | 1.27 | 2.36 | 1.57 |

FIG. 6

| Compound | % increase initial | S : N (RMS) | Signal | Noise amplitude | Area |
|---|---|---|---|---|---|
| 2,4 dinitrophenol | TIC | 3.38 | 1.94 | 0.55 | 1.92 |
| 4 amino biphenyl | TIC | 0.67 | 0.48 | 0.66 | 0.54 |
| Phenobarbital | TIC | 2.91 | 2.01 | 0.64 | 1.91 |

FIG. 7

ION SOURCE WITH SURFACE COATING

This application is a continuation-in-part of PCT/GB2010/000968, filed 13 May 2010, which claims priority to U.S. Provisional Patent Application Ser. Nos. 61/181,386, filed on 27 May 2009, and 61/181,418, filed 27 May 2009, and United Kingdom Patent Application Nos. 0908245.4, filed on 13 May 2009 and 0908247.0, filed 13 May 2009, and is a continuation-in-part of PCT/GB2010/000958, filed 13 May 2010, which claims priority to U.S. Provisional Patent Application Ser. No. 61/181,415, filed 27 May 2009, and United Kingdom Patent Application No. 0908246.2, filed 13 May 2009, and is a continuation-in-part of PCT/GB2010/000964, filed 13 May 2010, which claims priority to U.S. Provisional Patent Application Ser. No. 61/181,418, filed 27 May 2009, and United Kingdom Patent Application No. 0908247.0, filed 13 May 2009, and is a continuation-in-part of PCT/GB2010/000966, filed 13 May 2010, which claims priority to U.S. Provisional Patent Application Ser. No. 61/181,428, filed 27 May 2009, and United Kingdom Patent Application No. 0908248.8, filed 13 May 2009. The entire contents of these applications are incorporated herein by reference.

BACKGROUND

Mass spectrometers comprising a gas chromatograph coupled to an Electron Ionisation ("EI") or Chemical Ionisation ("CI") ion source are well known. A gas chromatograph comprises a packed column or open capillary tube located in a heated chamber. Analyte gas molecules are caused to pass through the column. Gas molecules having different sizes and structures will take different amounts of time to elute from the gas chromatograph.

Ions which emerge from the gas chromatograph are then commonly ionised either by an Electron Ionisation ion source or by a Chemical Ionisation ion source.

An EI ion source comprises an ion chamber through which an electron beam is passed. Analyte gas molecules interact with the electron beam and are subsequently ionised. The ionisation process is commonly referred to as being a hard ionisation process in that the analyte molecules are caused to fragment as a result of the ionisation process. The resulting EI fragment ions are then mass analysed.

A CI ion source utilises a reagent gas (e.g. methane or ammonia) and may be operated in either a positive or negative mode of operation. Neutral reagent gas is arranged to be ionised by interactions with free electrons emitted from a filament. The resulting reagent ions are then caused to interact and ionise neutral analyte molecules resulting in the formation of analyte ions. The resulting analyte ions are then mass analysed.

The coupling of a gas chromatography column with an EI or CI ion source and a mass spectrometer is a powerful technique that is widely used in many laboratories.

Conventionally, EI and CI ion sources comprise ion source chambers made from stainless steel. Stainless steel is considered to be relatively inert and non-reactive. However, conventional EI and CI ion source chambers need regular cleaning in order to maintain high performance.

Conventional EI and CI ion source chambers can suffer from increased surface contamination following regular analysis of complex matrix extracts such as urine, saliva, plasma, whole blood, waters and soils.

SUMMARY

Some embodiments entail coated ion source components, in particular EI and CI ion sources, for example, with a coating at least on portions of one of the source volume, trap, repeller electrodes and ion exit plate, to optionally improve the sensitivity of a mass spectrometer.

According to an aspect of some preferred embodiments, there is provided a mass spectrometer comprising an ion source, wherein the ion source comprises a first coating or surface provided on at least a portion of the ion source.

The ion source preferably comprises one or more ionisation chambers and the first coating or surface is preferably provided on at least a portion of the one or more ionisation chambers.

The ion source preferably further comprises one or more repeller electrodes and the first coating or surface is preferably provided on at least a portion of the one or more repeller electrodes.

The ion source and/or the one or more ionisation chambers and/or the one or more repeller electrodes forming part of the ion source are preferably made from a material selected from the group consisting of: (i) stainless steel; (ii) a steel alloy comprising a 11.5% chromium wt. %; (iii) an austenitic stainless steel; (iv) a ferritic stainless steel; (v) an austenitic-ferritic or duplex steel; (vi) titanium; (vii) a titanium alloy; (viii) a nickel-base alloy; (ix) a nickel-chromium alloy; (x) a nickel-chromium alloy comprising ≧50.0% nickel wt. %; and (xi) INCONEL® 600, 625, 690, 702, 718, 939 or X750.

The ion source and/or the one or more ionisation chambers and/or the one or more repeller electrodes forming part of the ion source preferably comprise stainless steel or an alloy comprising: (i) 0-0.01 wt. % carbon; (ii) 0.01-0.02 wt. % carbon; (iii) 0.02-0.03 wt. % carbon; (iv) 0.03-0.04 wt. % carbon; (v) 0.04-0.05 wt. % carbon; (vi) 0.05-0.06 wt. % carbon; (vii) 0.06-0.07 wt. % carbon; (viii) 0.07-0.08 wt. % carbon; and (ix)>0.08 wt. % carbon.

The ion source and/or the one or more ionisation chambers and/or the one or more repeller electrodes forming part of the ion source preferably comprise stainless steel or an alloy comprising: (i) 0-0.01 wt. % nitrogen; (ii) 0.01-0.02 wt. % nitrogen; (iii) 0.02-0.03 wt. % nitrogen; (iv) 0.03-0.04 wt. % nitrogen; (v) 0.04-0.05 wt. % nitrogen; (vi) 0.05-0.06 wt. % nitrogen; (vii) 0.06-0.07 wt. % nitrogen; and (viii)>0.07 wt. % nitrogen.

The ion source and/or the one or more ionisation chambers and/or the one or more repeller electrodes forming part of the ion source preferably comprise stainless steel or an alloy comprising: (i) 0-0.1 wt. % nitrogen; (ii) 0.1-0.2 wt. % nitrogen; (iii) 0.2-0.3 wt. % nitrogen: (iv) 0.3-0.4 wt. % nitrogen; (v) 0.4-0.5 wt. % nitrogen; (vi) 0.5-0.6 wt. % nitrogen; (vii) 0.6-0.7 wt. % nitrogen; and (viii)>0.7 wt. % nitrogen.

The ion source and/or the one or more ionisation chambers and/or the one or more repeller electrodes forming part of the ion source preferably comprise stainless steel or an alloy comprising: (i) 12.0-13.0 wt. % chromium; (ii) 13.0-14.0 wt. % chromium; (iii) 14.0-15.0 wt. % chromium; (iv) 15.0-16.0 wt. % chromium; (v) 16.0-17.0 wt. % chromium; (vi) 17.0-18.0 wt. % chromium; (vii) 18.0-19.0 wt. % chromium; (viii) 19.0-20.0 wt. % chromium; (ix) 20.0-21.0 wt. % chromium; (x) 21.0-22.0 wt. % chromium; (xi) 22.0-23.0 wt. % chromium; (xii) 23.0-24.0 wt. % chromium; (xiii) 24.0-25.0 wt. % chromium; (xiv) 25.0-26.0 wt. % chromium; (xv) 26.0-27.0 wt. % chromium; (xvi) 27.0-28.0 wt. % chromium; (xvii) 28.0-29.0 wt. % chromium; (xviii) 29.0-30.0 wt. % chromium; and (xix)>30.0 wt. % chromium.

The ion source and/or the one or more ionisation chambers and/or the one or more repeller electrodes forming part of the ion source preferably comprise stainless steel or an alloy comprising: (i) 0-1.0 wt. % nickel; (ii) 1.0-2.0 wt. % nickel; (iii) 2.0-3.0 wt. % nickel; (iv) 3.0-4.0 wt. % nickel; (v) 4.0-5.0 wt. % nickel; (vi) 5.0-6.0 wt. % nickel; (vii) 6.0-7.0 wt. % nickel; (viii) 7.0-8.0 wt. % nickel; (ix) 8.0-9.0 wt. % nickel; (x) 9.0-10.0 wt. % nickel; (xi) 10.0-11.0 wt. % nickel; (xii) 11.0-12.0 wt. % nickel; (xiii) 12.0-13.0 wt. % nickel; (xiv) 13.0-14.0 wt. % nickel; (xv) 14.0-15.0 wt. % nickel; (xvi) 15.0-16.0 wt. % nickel; (xvii) 16.0-17.0 wt. % nickel; (xviii) 17.0-18.0 wt. % nickel; (xix) 18.0-19.0 wt. % nickel; (xx) 19.0-20.0 wt. % nickel; (xxi) 20.0-21.0 wt. % nickel; (xxii) 21.0-22.0 wt. % nickel; (xxiii) 22.0-23.0 wt. % nickel; (xxiv) 23.0-24.0 wt. % nickel; (xxv) 24.0-25.0 wt. % nickel; (xxvi) 25.0-26.0 wt. % nickel; (xxvii) 26.0-27.0 wt. % nickel; (xxviii) 27.0-28.0 wt. % nickel; (xxix) 28.0-29.0 wt. % nickel; (xxx) 29.0-30.0 wt. % nickel; (xxxi) 30.0-31.0 wt. % nickel; (xxxii) 31.0-32.0 wt. % nickel; (xxviii) 32.0-33.0 wt. % nickel; (xxxiv) 33.0-34.0 wt. % nickel; (xxxv) 34.0-35.0 wt. % nickel; (xxxvi) 35.0-36.0 wt. % nickel; (xxxvii) 36.0-37.0 wt. % nickel; (xxxviii) 37.0-38.0 wt. % nickel; (xxxix) 38.0-39.0 wt. % nickel; (xl) 39.0-40.0 wt. % nickel; (xli) 40.0-41.0 wt. % nickel; (xlii) 41.0-42.0 wt. % nickel; (xliii) 42.0-43.0 wt. % nickel; (xliv) 43.0-44.0 wt. % nickel; (xlv) 44.0-45.0 wt. % nickel; (xlvi) 45.0-46.0 wt. % nickel; (xlvii)>46.0 wt. % nickel.

The ion source and/or the one or more ionisation chambers and/or the one or more repeller electrodes forming part of the ion source preferably comprise stainless steel or an alloy comprising: (i) 0-1.0 wt. % molybdenum; (ii) 1.0-2.0 wt. % molybdenum; (iii) 2.0-3.0 wt. % molybdenum; (iv) 3.0-4.0 wt. % molybdenum; (v) 4.0-5.0 wt. % molybdenum; (vi) 5.0-6.0 wt. % molybdenum; (vii) 6.0-7.0 wt. % molybdenum; (viii) 7.0-8.0 wt. % molybdenum; and (ix)>8.0 wt. % molybdenum.

The ion source and/or the one or more ionisation chambers and/or the one or more repeller electrodes forming part of the ion source preferably comprise stainless steel or an alloy comprising: (i) 0-1.0 wt. % copper; (ii) 1.0-2.0 wt. % copper; (iii) 2.0-3.0 wt. % copper; (iv) 3.0-4.0 wt. % copper; and (v)>4.0 wt. % copper.

The ion source and/or the one or more ionisation chambers and/or the one or more repeller electrodes forming part of the ion source preferably comprise stainless steel or an alloy comprising: (i) 0.01-1.0 wt. % X; (ii) 1.0-2.0 wt. % X; (iii) 2.0-3.0 wt. % X; (iv) 3.0-4.0 wt. % X; and (v)>4.0 wt. % X; wherein X comprises cobalt and/or tantalum and/or aluminium and/or titanium and/or niobium and/or silicon and/or manganese and/or tungsten and/or phosphorous.

The first coating or surface is preferably provided on: (i) at least 5%, 10%, 15%, 20%, 25%, 30%, 35%, 40%, 45%, 50%, 55%, 60%, 65%, 70%, 75%, 80%, 85%, 90%, 95% or 100% of an inner surface and/or an outer surface of the ion source; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface and/or an outer surface of the one or more ionisation chambers; and/or (iii) at least 5%, 10%, 15%, 20%, 25%, 30%, 35%, 40%, 45%, 50%, 55%, 60%, 65%, 70%, 75%, 80%, 85%, 90%, 95% or 100% of an inner surface and/or an outer surface of the one or more repeller electrodes.

Some preferred coatings or layers include: 1) metallic carbide, such as TiC; 2) metallic boride; 3) ceramic or DLC, such as SIC; and 4) ion-implanted transition metals, such as ion-implanted titanium. For convenience, these four groups are summarized, in turn, next.

1) Metallic Carbide—The first coating or surface is preferably selected from the group consisting of: (i) aluminium carbide or $Al_4C_3$; (ii) chromium carbide, CrC, $Cr_{23}C_6$, $Cr_3C$, $Cr_7C_3$ or $Cr_3C_2$; (iii) copper carbide; (iv) hafnium carbide, HfC or $HfC_{0.99}$; (v) iron carbide, $Fe_3C$, $Fe_7C_3$ or $Fe_2C$; (vi) iridium carbide; (vii) manganese carbide, MnC or $Mn_{23}C_6$; (viii) molybdenum carbide, $Mo_2C$ or $Mo_3C_2$; (ix) nickel carbide or NiC; (x) niobium carbide, NbC, $Nb_2C$, $NbC_{0.99}$, or $Nb_4C_3$; (xi) osmium carbide; (xii) palladium carbide; (xiii) platinum carbide; (xiv) rhenium carbide; (xv) rhodium carbide or RhC; (xvi) ruthenium carbide; (xvii) scandium carbide or ScC; (xviii) tantalum carbide, TaC, $Ta_2C$, $TaC_{0.99}$ or $Ta_4C_3$; (xix) titanium carbide or TiC; (xx) tungsten carbide, WC or $W_2C$; (xxi) vanadium carbide, VC, $VC_{0.97}$, $V_4C_3$; (xxii) yttrium carbide or $YC_2$; (xxiii) zirconium carbide, ZrC or $ZrC_{0.97}$; and (xxiv) silicon carbide or SiC.

The first coating or surface preferably comprises: (i) a transition metal carbide; (ii) a carbide alloy; or (iii) a mixed metal carbide alloy.

The first coating or surface preferably has either:

(a) a resistivity selected from the group consisting of: (i) $<10^3$ Ω-m; (ii) $<10^{-4}$ Ω-m; (iii) $<10^{-5}$ Ω-m; (iv) $<10^{-6}$ Ω-m; (v) $<10^{-7}$ Ω-m; (vi) $10^{-3}$-$10^{-4}$ Ω-m; (vii) $10^{-4}$-$10^{-5}$ Ω-m; (viii) $10^{-5}$-$10^{-6}$ Ω-m; and (ix) $10^{-6}$-$10^{-7}$ Ω-m; and/or (b) a Vickers hardness number or Vickers Pyramid Number (HV) selected from the group consisting of: (i) >1000; (ii) 1000-1100; (iii) 1100-1200; (iv) 1200-1300; (v) 1300-1400; (vi) 1400-1500; (vii) 1500-1600; (viii) 1600-1700; (ix) 1700-1800; (x) 1800-1900; (xi) 1900-2000; (xii) 2000-2100; (xiii) 2100-2200; (xiv) 2200-2300; (xv) 2300-2400; (xvi) 2400-2500; (xvii) 2500-2600; (xviii) 2600-2700; (xix) 2700-2800; (xx) 2800-2900; (xxi) 2900-3000; (xxii) 3000-3100; (xxiii) 3100-3200; (xxiv) 3200-3300; (xv) 3300-3400; (xvi) 3400-3500; and (xvii) >3500, wherein the Vickers hardness number or Vickers Pyramid Number is determined at a load of 30, 40, 50, 60 or 70 kg; and/or (c) a Vickers microhardness selected from the group consisting of: (i) >1000 kg/mm; (ii) 1000-1100 kg/mm; (iii) 1100-1200 kg/mm; (iv) 1200-1300 kg/mm; (v) 1300-1400 kg/mm; (vi) 1400-1500 kg/mm; (vii) 1500-1600 kg/mm; (viii) 1600-1700 kg/mm; (ix) 1700-1800 kg/mm; (x) 1800-1900 kg/mm; (xi) 1900-2000 kg/mm; (xii) 2000-2100 kg/mm; (xiii) 2100-2200 kg/mm; (xiv) 2200-2300 kg/mm; (xv) 2300-2400 kg/mm; (xvi) 2400-2500 kg/mm; (xvii) 2500-2600 kg/mm; (xviii) 2600-2700 kg/mm; (xix) 2700-2800 kg/mm; (xx) 2800-2900 kg/mm; (xxi) 2900-3000 kg/mm; (xxii) 3000-3100 kg/mm; (xxiii) 3100-3200 kg/mm; (xxiv) 3200-3300 kg/mm; (xv) 3300-3400 kg/mm; (xvi) 3400-3500 kg/mm; and (xvii) >3500 kg/mm, and/or (d) a thickness selected from the group consisting of: (i)<1 μm; (ii) 1-2 μm; (iii) 2-3 μm; (iv) 3-4 μm; (v) 4-5 μm; (vi) 5-6 μm; (vii) 6-7 μm; (viii) 7-8 μm; (ix) 8-9 μm; (x) 9-10 μm; (xi) >10 μm; and/or (e) a density selected from the group consisting of: (i) <3.0 g $cm^3$; (ii) 3.0-3.5 g $cm^{-3}$; (iii) g $cm^{-3}$; (iv) 4.0-4.5 g $cm^{-3}$; (v) 4.5-5.0 g $cm^{-3}$; (vi) 5.0-5.5 g $cm^{-3}$; (vii) 5.5-6.0 g $cm^{-3}$; (viii) 6.0-6.5 g $cm^{-3}$; (ix) 6.5-7.0 g $cm^{-3}$; (x) 7.0-7.5 g $cm^{-3}$; (xi) 7.5-8.0 g $cm^{-3}$; (xii) 8.0-8.5 g $cm^{-3}$; (xiii) 8.5-9.0 g $cm^{-3}$; (xiv) 9.0-9.5 g $cm^{-3}$; (xv) 9.5-10.0 g $cm^{-3}$; (xvi) 10.0-10.5 g $cm^{-3}$; (xvii) 10.5-11.0 g $cm^{-3}$; (xviii) 11.0-11.5 g $cm^{-3}$; (xix) 11.5-12.0 g $cm^{-3}$; (xx) 12.0-12.5 g $cm^{-3}$; (xxi) 12.5-13.0 g $cm^{-3}$; (xxii) 13.0-13.5 g $cm^{-3}$; (xxiii) 13.5-14.0 g $cm^{-3}$; (xxiv) 14.0-14.5 g $cm^{-3}$; (xxv) 14.5-15.0 g $cm^{-3}$; (xxvi) 15.0-15.5 g $cm^{-3}$; (xxvii) 15.5-16.0 g $cm^{-3}$; (xxviii) 16.0-16.5 g $cm^{-3}$; (xxix) 16.5-17.0 g $cm^{-3}$; (xxx) 17.0-17.5 g $cm^{-3}$; (xxxi) 17.5-18.0 g $cm^{-3}$; (xxxii) 18.0-18.5 g $cm^{-3}$; (xxxiii) 18.5-19.0 g $cm^{-3}$; (xxxiv) 19.0-19.5 g $cm^{-3}$; (xxxv) 19.5-20.0 g $cm^{-3}$; and (xxxvi) >20.0 g $cm^{-3}$; and/or (f) a coefficient of friction selected from the group consisting of: (i) <0.01; (ii) 0.01-0.02; (iii) 0.02-0.03; (iv) 0.03-0.04; (v) 0.04-0.05; (vi) 0.05-0.06; (vii) 0.06-0.07; (viii) 0.07-0.08; (ix) 0.08-0.09; (x) 0.09-0.10; and (xi) >0.1.

The ion source is preferably selected from the group consisting of: (i) an Electrospray ionisation ("ESI") ion source; (ii) an Atmospheric Pressure Photo Ionisation ("APPI") ion source; (iii) an Atmospheric Pressure Chemical Ionisation ("APCI") ion source; (iv) a Matrix Assisted Laser Desorption Ionisation ("MALDI") ion source; (v) a Laser Desorption Ionisation ("LDI") ion source; (vi) an Atmospheric Pressure Ionisation ("API") ion source; (vii) a Desorption Ionisation on Silicon ("DIOS") ion source; (viii) an Electron Impact ("EI") ion source; (ix) a Chemical Ionisation ("CI") ion source; (x) a Field Ionisation ("Fr") ion source; (xi) a Field Desorption ("FD") ion source; (xii) an Inductively Coupled Plasma ("ICP") ion source; (xiii) a Fast Atom Bombardment ("FAB") ion source; (xiv) a Liquid Secondary Ion Mass Spectrometry ("LSIMS") ion source; (xv) a Desorption Electrospray Ionisation ("DESI") ion source; (xvi) a Nickel-63 radioactive ion source; (xvii) an Atmospheric Pressure Matrix Assisted Laser Desorption Ionisation ion source; (xviii) a Thermospray ion source; (xix) an Atmospheric Sampling Glow Discharge Ionisation ("ASGDI") ion source; and (xx) a Glow Discharge ("GD") ion source.

The portion of the ion source having the first coating or surface is preferably selected from the group consisting of: (i) an ion chamber; (ii) a repeller electrode; and (iii) an exit plate or exit aperture arranged at the exit of the ion source through which ions of interest are desired to be transmitted.

According to an aspect of the present invention there is provided a method of mass spectrometry comprising:

ionising ions in an ion source having a first coating or surface provided on at least a portion of the ion source, wherein the first coating or surface comprises a metallic carbide coating or surface.

According to an aspect of the present invention there is provided a method of making an ion source and/or one or more ionisation chambers and/or one or more repeller electrodes forming part of an ion source for a mass spectrometer comprising:

depositing, sputtering or forming a first coating or surface on at least a portion of an ion source and/or one or more ionisation chambers and/or one or more repeller electrodes forming part of the ion source, wherein the first coating or surface comprises a metallic carbide coating or surface.

The step of depositing, sputtering or forming the first coating or surface preferably comprises using a method selected from the group consisting of: (i) magnetron sputtering; (ii) closed field unbalanced magnetron sputter ion plating; (iii) electroplating; (iv) thermal spray coating; (v) vapour deposition; (vi) Chemical Vapour Deposition ("CVD"); (vii) combustion torch/flame spraying; (viii) electric arc spraying; (ix) plasma spraying; (x) ion plating; (xi) ion implantation; (xii) sputtering; (xiii) sputter deposition; (xiv) laser surface alloying; (xv) Physical Vapour Deposition ("PVD"); (xvi) plasma-based ion plating; (xvii) gas plasma discharge sputtering; (xviii) laser cladding; (xix) plasma enhanced Chemical Vapour Deposition; (xx) low pressure Chemical Vapour Deposition; (xxi) laser enhanced Chemical Vapour Deposition; (xxii) active reactive evaporation; (xxiii) Pulsed Laser Deposition ("PLD"); (xxiv) RF-sputtering; (xxv) Ion-Beam Sputtering ("IBS"); (xxvi) reactive sputtering; (xxvii) Ion-Assisted Deposition ("IAD"); (xxviii) high target utilisation sputtering; (xxix) High Power Impulse Magnetron Sputtering ("HIPIMS"); and (xxx) DC-sputtering.

Preferably, the first coating or surface is selected from the group consisting of: (i) aluminium carbide or $Al_4C_3$; (ii) chromium carbide, CrC, $Cr_{23}C_6$, $Cr_3C$, $Cr_7C_3$ or $Cr_3C_2$; (iii) copper carbide; (iv) hafnium carbide, HfC or $HfC_{0.99}$; (v) iron carbide, $Fe_3C$, $Fe_7C_3$ or $Fe_2C$; (vi) iridium carbide; (vii) manganese carbide, MnC or $Mn_{23}C_6$; (viii) molybdenum carbide, $Mo_2C$ or $Mo_3C_2$; (ix) nickel carbide or NiC; (x) niobium carbide, NbC, $Nb_2C$, $NbC_{0.99}$, or $Nb_4C_3$; (xi) osmium carbide; (xii) palladium carbide; (xiii) platinum carbide; (xiv) rhenium carbide; (xv) rhodium carbide or RhC; (xvi) ruthenium carbide; (xvii) scandium carbide or ScC; (xviii) tantalum carbide, TaC, $Ta_2C$, $TaC_{0.99}$ or $Ta_4C_3$; (xix) titanium carbide or TiC; (xx) tungsten carbide, WC or $W_2C$; (xxi) vanadium carbide, VC, $VC_{0.97}$, $V_4C_3$; (xxii) yttrium carbide or $YC_2$; (xxiii) zirconium carbide, ZrC or $ZrC_{0.97}$; and (xxiv) silicon carbide or SiC.

2) Metallic Boride—The first coating or surface is preferably selected from the group consisting of: (i) aluminium diboride, aluminium dodecaboride, $AlB_2$ or $AlB_{12}$; (ii) chromium diboride or $CrB_2$; (iii) copper boride; (iv) hafnium diboride or $HfB_2$; (v) iridium boride; (vi) iron boride, FeB or $Fe_2B$; (vii) manganese boride, manganese diboride, MnB or $MnB_2$; (viii) molybdenum diboride or $MoB_2$; (ix) nickel boride, NiB, $Ni_2B$ or $Ni_3B$; (x) niobium diboride or $NbB_2$; (xi) osmium boride; (xii) palladium boride; (xiii) platinum boride; (xiv) rhenium boride; (xv) rhodium boride; (xvi) ruthenium boride; (xvii) scandium boride or ScB; (xviii) silicon hexaboride, silicon tetraboride, $SiB_6$ or $SiB_4$; (xix) tantalum diboride or $TaB_2$; (xx) titanium diboride or $TiB_2$; (xxi) tungsten diboride or $WB_2$; (xxii) vanadium diboride or $VB_2$; (xxiii) yttrium boride; and (xxiv) zirconium diboride or $ZrB_2$.

The first coating or surface preferably comprises: (i) a transition metal boride or diboride; (ii) a boride or diboride alloy; or (iii) a mixed metal boride or diboride alloy.

The first coating or surface preferably has either:

(a) a resistivity selected from the group consisting of: (i) $<10^{-3}$ Ω-m; (ii) $<10^{-4}$ Ω-m; (iii) $<10^{-5}$ Ω-m; (iv) $<10^{-6}$ Ω-m; (v) $<10^{-7}$ Ω-m; (vi) $10^{-3}$-$10^{-4}$ Ω-m; (vii) $10^{-4}$-$10^{-5}$ Ω-m; (viii) $10^{-5}$-$10^{-6}$ Ω-m; and (ix) $10^{-6}$-$10^{-7}$ Ω-m; and/or (b) a Vickers hardness number or Vickers Pyramid Number (HV) selected from the group consisting of: (i) >1000; (ii) 1000-1100; (iii) 1100-1200; (iv) 1200-1300; (v) 1300-1400; (vi) 1400-1500; (vii) 1500-1600; (viii) 1600-1700; (ix) 1700-1800; (x) 1800-1900; (xi) 1900-2000; (xii) 2000-2100; (xiii) 2100-2200; (xiv) 2200-2300; (xv) 2300-2400; (xvi) 2400-2500; (xvii) 2500-2600; (xviii) 2600-2700; (xix) 2700-2800; (xx) 2800-2900; (xxi) 2900-3000; (xxii) 3000-3100; (xxiii) 3100-3200; (xxiv) 3200-3300; (xv) 3300-3400; (xvi) 3400-3500; and (xvii) >3500, wherein the Vickers hardness number or Vickers Pyramid Number is determined at a load of 30, 40, 50, 60 or 70 kg; and/or (c) a Vickers microhardness selected from the group consisting of: (i) >1000 kg/mm; (ii) 1000-1100 kg/mm; (iii) 1100-1200 kg/mm; (iv) 1200-1300 kg/mm; (v) 1300-1400 kg/mm; (vi) 1400-1500 kg/mm; (vii) 1500-1600 kg/mm; (viii) 1600-1700 kg/mm: (ix) 1700-1800 kg/mm; (x) 1800-1900 kg/mm; (xi) 1900-2000 kg/mm; (xii) 2000-2100 kg/mm; (xiii) 2100-2200 kg/mm; (xiv) 2200-2300 kg/mm; (xv) 2300-2400 kg/mm; (xvi) 2400-2500 kg/mm; (xvii) 2500-2600 kg/mm; (xviii) 2600-2700 kg/mm; (xix) 2700-2800 kg/mm; (xx) 2800-2900 kg/mm; (xxi) 2900-3000 kg/mm; (xxii) 3000-3100 kg/mm; (xxiii) 3100-3200 kg/mm; (xxiv) 3200-3300 kg/mm; (xv) 3300-3400 kg/mm; (xvi) 3400-3500 kg/mm; and (xvii) >3500 kg/mm, and/or (d) a thickness selected from the group consisting of: (i) <1 μm; (ii) 1-2 μm; (iii) 2-3 μm; (iv) 3-4 μm; (v) 4-5 μm; (vi) 5-6 μm; (vii) 6-7 μm; (viii) 7-8 μm; (ix) 8-9 μm; (x) 9-10 μm; (xi) >10 μm; and/or (e) a density selected from the group consisting of: (i) <3.0 g $cm^{-3}$; (ii) 3.0-3.5 g $cm^{-3}$; (iii) 3.5-4.0 g $cm^{-3}$; (iv) 4.0-4.5 g $cm^{-3}$; (v) 4.5-5.0 g $cm^{-3}$; (vi) 5.0-5.5 g $cm^{-3}$; (vii) 5.5-6.0 g $cm^{-3}$; (viii) 6.0-6.5 g $cm^{-3}$; (ix) 6.5-7.0 g $cm^{-3}$; (x) 7.0-7.5 g $cm^{-3}$; (xi) 7.5-8.0 g $cm^{-3}$; (xii) 8.0-8.5 g $cm^{-3}$; (xiii) 8.5-9.0 g $cm^{-3}$; (xiv) 9.0-9.5 g $cm^{-3}$; (xv) 9.5-10.0 g $cm^{-3}$; (xvi) 10.0-10.5 g $cm^{-3}$; (xvii) 10.5-11.0 g $cm^{-3}$; (xviii) 11.0-11.5 g $cm^{-3}$; (xix) 11.5-12.0 g $cm^{-3}$; (xx) 12.0-12.5 g $cm^{-3}$; (xxi) 12.5-13.0 g $cm^{-3}$; (xxii) 13.0-13.5 g $cm^{-3}$; (xxiii) 13.5-14.0 g $cm^{-3}$; (xxiv) 14.0-14.5 g $cm^{-3}$; (xxv) 14.5-15.0 g $cm^{-3}$; (xxvi) 15.0-15.5 g $cm^{-3}$; (xxvii) 15.5-16.0 g $cm^{-3}$; (xxviii) 16.0-16.5 g $cm^{-3}$; (xxix) 16.5-17.0 g $cm^{-3}$; (xxx) 17.0-17.5 g $cm^{-3}$; (xxxi) 17.5-18.0 g $cm^{-3}$; (xxxii) 18.0-18.5 g $cm^{-3}$; (xxxiii) 18.5-19.0 g $cm^{-3}$; (xxxiv) 19.0-19.5 g $cm^{-3}$; (xxxv) 19.5-20.0 g $cm^{-3}$; and (xxxvi) >20.0 g $cm^{-3}$; and/or (f) a coefficient of friction selected from the group consisting of: (i) <0.01; (ii) 0.01-0.02; (iii) 0.02-0.03; (iv) 0.03-0.04; (v) 0.04-0.05; (vi) 0.05-0.06; (vii) 0.06-0.07; (viii) 0.07-0.08; (ix) 0.08-0.09; (x) 0.09-0.10; and (xi) >0.1.

The portion of the ion source having the first coating or surface is preferably selected from the group consisting of: (i) an ion chamber; (ii) a repeller electrode; and (iii) an exit plate or exit aperture arranged at the exit of the ion source through which ions of interest are desired to be transmitted.

The ion source is preferably selected from the group consisting of: (i) an Electrospray ionisation ("ESI") ion source; (ii) an Atmospheric Pressure Photo Ionisation ("APPI") ion source; (iii) an Atmospheric Pressure Chemical Ionisation ("APCI") ion source; (iv) a Matrix Assisted Laser Desorption Ionisation ("MALDI") ion source; (v) a Laser Desorption Ionisation ("LDI") ion source; (vi) an Atmospheric Pressure Ionisation ("API") ion source; (vii) a Desorption Ionisation on Silicon ("DIOS") ion source; (viii) an Electron Impact ("EI") ion source; (ix) a Chemical Ionisation ("CI") ion source; (x) a Field Ionisation ("FI") ion source; (xi) a Field Desorption ("FD") ion source; (xii) an Inductively Coupled Plasma ("ICP") ion source; (xiii) a Fast Atom Bombardment ("FAB") ion source; (xiv) a, Liquid Secondary Ion Mass Spectrometry ("LSIMS") ion source; (xv) a Desorption Electrospray Ionisation ("DESI") ion source; (xvi) a Nickel-63 radioactive ion source; (xvii) an Atmospheric Pressure Matrix Assisted Laser Desorption Ionisation ion source; (xviii) a Thermospray ion source; (xix) an Atmospheric Sampling Glow Discharge Ionisation ("ASGDI") ion source; and (xx) a Glow Discharge ("GD") ion source.

According to another aspect of the present invention there is provided a method of mass spectrometry comprising:

ionising ions in an ion source having a first coating or surface provided on at least a portion of the ion source, wherein the first coating or surface comprises a metallic boride coating or surface.

According to another aspect of the present invention there is provided a method of making an ion source and/or one or more ionisation chambers and/or one or more repeller electrodes forming part of an ion source for a mass spectrometer comprising:

depositing, sputtering or forming a first coating or surface on at least a portion of an ion source and/or one or more ionisation chambers and/or one or more repeller electrodes forming part of the ion source, wherein the first coating or surface comprises a metallic boride coating or surface.

The step of depositing, sputtering or forming the first coating or surface preferably comprises using a method selected from the group consisting of: (i) magnetron sputtering; (ii) closed field unbalanced magnetron sputter ion plating; (iii) electroplating; (iv) thermal spray coating; (v) vapour deposition; (vi) Chemical Vapour Deposition ("CVD"); (vii) combustion torch/flame spraying; (viii) electric arc spraying; (ix) plasma spraying; (x) ion plating; (xi) ion implantation; (xii) sputtering; (xiii) sputter deposition; (xiv) laser surface alloying; (xv) Physical Vapour Deposition ("PVD"); (xvi) plasma-based ion plating; (xvii) gas plasma discharge sputtering; (xviii) laser cladding; (xix) plasma enhanced Chemical Vapour Deposition; (xx) low pressure Chemical Vapour Deposition; (xxi) laser enhanced Chemical Vapour Deposition; (xxii) active reactive evaporation; (xxiii) Pulsed Laser Deposition ("PLD"); (xxiv) RF-sputtering; (xxv) Ion-Beam Sputtering ("IBS"); (xxvi) reactive sputtering; (xxvii) Ion-Assisted Deposition ("IAD"); (xxviii) high target utilisation sputtering: (xxix) High Power Impulse Magnetron Sputtering ("HIPIMS"); and (xxx) DC-sputtering.

Preferably, the first coating or surface is selected from the group consisting of: (i) aluminium diboride, aluminium dodecaboride, $AlB_2$ or $AlB_{12}$; (ii) chromium diboride or $CrB_2$; (iii) copper boride; (iv) hafnium diboride or $HfB_2$; (v) iridium boride; (vi) iron boride, FeB or $Fe_2B$; (vii) manganese boride, manganese diboride, MnB or $MnB_2$; (viii) molybdenum diboride or $MoB_2$; (ix) nickel boride, NIB, $Ni_2B$ or $Ni_3B$; (x) niobium diboride or $NbB_2$; (xi) osmium boride; (xii) palladium boride; (xiii) platinum boride; (xiv) rhenium boride; (xv) rhodium boride; (xvi) ruthenium boride; (xvii) scandium boride or ScB; (xviii) silicon hexaboride, silicon tetraboride, $SiB_5$ or $SiB_4$; (xix) tantalum diboride or $TaB_2$; (xx) titanium diboride or $TiB_2$; (xxi) tungsten diboride or $WB_2$; (xxii) vanadium diboride or $VB_2$; (xxiii) yttrium boride; and (xxiv) zirconium diboride or $ZrB_2$.

3) Ceramic, and DLC—A Diamond Like Carbon ("DLC") coating is an amorphous carbon coating and differs therefore from diamond coatings which are polycrystalline. A DLC coating is conductive which is particularly advantageous compared with diamond coatings which are insulating and non-conductive.

A DLC coating also has a low coefficient of friction and is therefore highly non-stick. DLC coatings are also particularly robust and have a high hardness and have a high temperature resistance. The DLC coating is therefore particularly advantageous compared with graphite which will tend to oxidise at high temperatures.

The Diamond Like Carbon coating preferably comprises a SP2 (graphite) to SP3 (diamond) ratio selected from the group consisting of: (i) <0.1; (ii) 0.1-0.2; (iii) 0.2-0.3; (iv) 0.3-0.4; (v) 0.4-0.5; (vi) 0.5-0.6; (vii) 0.6-0.7; (viii) 0.7-0.8; (ix) 0.8-0.9; and (x) 0.9-1.0.

The Diamond Like Carbon coating or surface preferably comprises a carbon coating or surface having a diamond-like structure.

The Diamond Like Carbon coating or surface preferably further comprises a metal component such as chromium.

The ceramic coating or surface preferably comprises silicon carbide or SiC.

The first coating or surface preferably has either:

(a) a resistivity selected from the group consisting of: (i) $<10^{-3}$ Ω-m; (ii) $<10^{-4}$ Ω-m; (iii) $<10^{-5}$ Ω-m; (iv) $<10^{-6}$ Ω-m; (v) $<10^{-7}$ Ω-m; (vi) $10^{-3}$-$10^{-4}$ Ω-m; (vii) $10^{-4}$-$10^{-5}$ Ω-m; (viii) $10^{-5}$-$10^{-6}$ Ω-m; and (ix) $10^{-6}$-$10^{-7}$ Ω-m; and/or (b) a Vickers hardness number or Vickers Pyramid Number (HV) selected from the group consisting of: (i) >1000; (ii) 1000-1100; (iii) 1100-1200; (iv) 1200-1300; (v) 1300-1400; (vi) 1400-1500; (vii) 1500-1600; (viii) 1600-1700; (ix) 1700-1800; (x) 1800-1900; (xi) 1900-2000; (xii) 2000-2100; (xiii) 2100-2200; (xiv) 2200-2300; (xv) 2300-2400; (xvi) 2400-2500; (xvii) 2500-2600; (xviii) 2600-2700; (xix) 2700-2800; (xx) 2800-2900; (xxi) 2900-3000; (xxii) 3000-3100; (xxiii) 3100-3200; (xxiv) 3200-3300; (xv) 3300-3400; (xvi) 3400-3500; and (xvii) >3500, wherein the Vickers hardness number or Vickers Pyramid Number is determined at a load of 30, 40, 50, 60 or 70 kg; and/or (c) a Vickers microhardness selected from the group consisting of: (i) >1000 kg/mm; (ii) 1000-1100 kg/mm; (iii) 1100-1200 kg/mm; (iv) 1200-1300 kg/mm; (v) 1300-1400 kg/mm; (vi) 1400-1500 kg/mm; (vii) 1500-1600 kg/mm; (viii) 1600-1700 kg/mm; (ix) 1700-1800 kg/mm; (x) 1800-1900 kg/mm; (xi) 1900-2000 kg/mm; (xii) 2000-2100 kg/mm; (xiii) 2100-2200 kg/mm; (xiv) 2200-2300 kg/mm; (xv) 2300-2400 kg/mm; (xvi) 2400-2500 kg/mm; (xvii) 2500-2600 kg/mm; (xviii) 2600-2700 kg/mm; (xix) 2700-2800 kg/mm; (xx) 2800-2900 kg/mm; (xxi) 2900-3000 kg/mm; (xxii) 3000-3100 kg/mm; (xxiii) 3100-3200 kg/mm; (xxiv) 3200-3300 kg/mm; (xv) 3300-3400 kg/mm; (xvi) 3400-3500 kg/mm; and (xvii) >3500 kg/mm, and/or (d) a thickness selected from the group consisting of: (i) <1 μm; (ii) 1-2 μm; (iii) 2-3 μm; (iv) 3-4 μm; (v) 4-5 μm; (vi) 5-6 μm; (vii) 6-7 μm; (viii) 7-8 μm; (ix) 8-9 μm; (x) 9-10 μm; (xi) >10 μm; and/or (e) a density selected from the group consisting of: (i) <3.0 g $cm^{-3}$; (ii) 3.0-3.5 g $cm^{-3}$; (iii) 3.5-4.0 g $cm^{-3}$; (iv) 4.0-4.5 g $cm^{-3}$; (v) 4.5-5.0 g $cm^{-3}$; (vi) 5.0-5.5 g $cm^{-3}$; (vii) 5.5-6.0 g $cm^{-3}$; (viii) 6.0-6.5 g $cm^{-3}$; (ix) 6.5-7.0 g $cm^{-3}$; (x) 7.0-7.5 g $cm^{-3}$; (xi) 7.5-8.0 g $cm^{-3}$; (xii) 8.0-8.5 g $cm^{-3}$; (xiii) 8.5-9.0 g $cm^{-3}$; (xiv) 9.0-9.5 g $cm^{-3}$; (xv) 9.5-10.0 g $cm^{-3}$; (xvi) 10.0-10.5 g $cm^{-3}$; (xvii) 10.5-11.0 g $cm^{-3}$; (xviii) 11.0-11.5 g $cm^{-3}$; (xix) 11.5-12.0 g $cm^{-3}$; (xx) 12.0-12.5 g $cm^{-3}$; (xxi) 12.5-13.0 g $cm^{-3}$; (xxii) 13.0-13.5 g $cm^{-3}$; (xxiii) 13.5-14.0 g $cm^{-3}$; (xxiv) 14.0-14.5 g $cm^{-3}$; (xxv) 14.5-15.0 g $cm^{-3}$; (xxvi) 15.0-15.5 g $cm^{-3}$; (xxvii) 15.5-16.0 g $cm^{-3}$; (xxviii) 16.0-16.5 g $cm^{-3}$; (xxix) 16.5-17.0 g $cm^{-3}$; (xxx) 17.0-17.5 g $cm^{-3}$; (xxxi) 17.5-18.0 g $cm^{-3}$: (xxxii) 18.0-18.5 g $cm^{-3}$; (xxxiii) 18.5-19.0 g $cm^{-3}$; (xxxiv) 19.0-19.5 g $cm^{-3}$; (xxxv) 19.5-20.0 g $cm^{-3}$, and (xxxvi) >20.0 g $cm^{-3}$; and/or (f) a coefficient of friction selected from the group consisting of: (i) <0.01; (ii) 0.01-0.02; (iii) 0.02-0.03; (iv) 0.03-0.04; (v) 0.04-0.05; (vi) 0.05-0.06; (vii) 0.06-0.07; (viii) 0.07-0.08; (ix) 0.08-0.09; (x) 0.09-0.10; and (xi) >0.1.

The portion of the ion source having the first coating or surface is preferably selected from the group consisting of: (i) an ion chamber; (ii) a repeller electrode; and (iii) an exit plate or exit aperture arranged at the exit of the ion source through which ions of interest are desired to be transmitted.

The ion source is preferably selected from the group consisting of: (i) an Electrospray ionisation ("ESI") ion source; (ii) an Atmospheric Pressure Photo Ionisation ("APPI") ion source; (iii) an Atmospheric Pressure Chemical Ionisation ("APCI") ion source; (iv) a Matrix Assisted Laser Desorption Ionisation ("MALDI") ion source; (v) a Laser Desorption Ionisation ("LDI") ion source; (vi) an Atmospheric Pressure Ionisation ("API") ion source; (vii) a Desorption Ionisation on Silicon ("DIOS") ion source; (viii) an Electron Impact ("EI") ion source; (ix) a Chemical Ionisation ("CI") ion source; (x) a Field Ionisation ("FI") ion source; (xi) a Field Desorption ("FD") ion source; (xii) an Inductively Coupled Plasma ("ICP") ion source; (xiii) a Fast Atom Bombardment ("FAB") ion source; (xiv) a Liquid Secondary Ion Mass Spectrometry ("LSIMS") ion source; (xv) a Desorption Electrospray Ionisation ("DESI") ion source; (xvi) a Nickel-63 radioactive ion source; (xvii) an Atmospheric Pressure Matrix Assisted Laser Desorption Ionisation ion source; (xviii) a Thermospray ion source; (xix) an Atmospheric Sampling Glow Discharge Ionisation ("ASGDI") ion source; and (xx) a Glow Discharge ("GD") ion source.

According to an aspect of the present invention there is provided a method of mass spectrometry comprising:

ionising ions in an ion source having a first coating or surface provided on at least a portion of the ion source, wherein the first coating or surface comprises a ceramic coating or surface or a Diamond Like Carbon ("DLC") coating or surface.

According to an aspect of the present invention there is provided a method of making an ion source and/or one or more ionisation chambers and/or one or more repeller electrodes forming part of an ion source for a mass spectrometer comprising:

depositing, sputtering or forming a first coating or surface on at least a portion of an ion source and/or one or more ionisation chambers and/or one or more repeller electrodes forming part of the ion source, wherein the first coating or surface comprises a ceramic coating or surface or a Diamond Like Carbon ("DLC") coating or surface.

The step of depositing, sputtering or forming the first coating or surface preferably comprises using a method selected from the group consisting of: (i) magnetron sputtering; (ii) closed field unbalanced magnetron sputter ion plating; (iii) electroplating; (iv) thermal spray coating; (v) vapour deposition; (vi) Chemical Vapour Deposition ("CVD"); (vii) combustion torch/flame spraying; (viii) electric arc spraying; (ix) plasma spraying; (x) ion plating; (xi) ion implantation; (xii) sputtering; (xiii) sputter deposition; (xiv) laser surface alloying; (xv) Physical Vapour Deposition ("PVD"); (xvi) plasma-based ion plating; (xvii) gas plasma discharge sputtering; (xviii) laser cladding; (xix) plasma enhanced Chemical Vapour Deposition; (xx) low pressure Chemical Vapour Deposition; (xxi) laser enhanced Chemical Vapour Deposition; (xxii) active reactive evaporation; (xxiii) Pulsed Laser Deposition ("PLD"); (xxiv) RF-sputtering; (xxv) Ion-Beam Sputtering ("IBS"); (xxvi) reactive sputtering; (xxvii) Ion-Assisted Deposition ("IAD"); (xxviii) high target utilisation sputtering; (xxix) High Power Impulse Magnetron Sputtering ("HIPIMS"); and (xxx) DC-sputtering.

The step of depositing, sputtering or forming the first coating or surface preferably comprises creating a glow or RF discharge to the ion source and/or the one or more ionisation chambers and/or the one or more repeller electrodes forming part of the ion source in an atmosphere containing a hydrocarbon gas, wherein the glow or RF discharge causes a breakdown of the hydrocarbon gas so that carbon from the gas is deposited on the ion source and/or the one or more ionisation chambers and/or the one or more repeller electrodes forming part of the ion source.

The step of depositing, sputtering or forming the first coating or surface preferably comprises applying a pulsed DC biased power supply to the ion source and/or the one or more ionisation chambers and/or the one or more repeller electrodes forming part of the ion source in an atmosphere containing a hydrocarbon gas, wherein the pulsed DC biased power supply causes a breakdown of the hydrocarbon gas so that carbon from the gas is deposited on the ion source and/or the one or more ionisation chambers and/or the one or more repeller electrodes forming part of the ion source.

The hydrocarbon gas preferably comprises butane.

The step of depositing, sputtering or forming the first coating or surface preferably further comprises simultaneously depositing a metal with the deposition of carbon from the hydrocarbon gas to form a Diamond Like Carbon coating or surface including a metal therein. The metal preferably comprises chromium.

4) Ion-Implanted Transition Metal—According to another aspect, there is provided a mass spectrometer comprising an ion source formed from titanium which has been subjected to ion implantation.

The ion source preferably comprises one or more ionisation chambers formed from titanium which has been subjected to ion implantation.

The ion source preferably further comprises one or more repeller electrodes formed from titanium which has been subjected to ion implantation.

According to an embodiment: (i) at least 5%, 10%, 15%, 20%, 25%, 30%, 35%, 40%, 45%, 50%, 55%, 60%, 65%, 70%, 75%, 80%, 85%, 90%, 95% or 100% of an inner surface and/or an outer surface of the ion source has been subjected to ion implantation; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface and/or an outer surface of the one or more ionisation chambers has been subjected to ion implantation; and/or (iii) at least 5%, 10%, 15%, 20%, 25%, 30%, 35%, 40%, 45%, 50%, 55%, 60%, 65%, 70%, 75%, 80%, 85%, 90%, 95% or 100% of an inner surface and/or an outer surface of the one or more repeller electrodes forming part of the ion source has been subjected to ion implantation.

The ion source and/or the one or more ionisation chambers and/or the one or more repeller electrodes forming part of the ion source preferably comprise titanium which has been subjected to ion implantation with ions selected from the group consisting of: (i) nitrogen; (ii) carbon; (iii) boron; (iv) oxygen; (v) argon; (vi) calcium; (vii) phosphorous; (viii) carbon-oxygen; (ix) neon; (x) sodium; (xi) chromium; (xii) vanadium; and (xii) fluorine.

The ion source and/or the one or more ionisation chambers and/or the one or more repeller electrodes forming part of the ion source have preferably been subjected to an ion implantation dose selected from the group consisting of: (i) $<10^{13}$ ions/cm$^2$; (ii) $10^{13}$-$10^{14}$ ions/cm$^2$; (iii) $10^{14}$-$10^{15}$ ions/cm$^2$; (iv) $10^{16}$-$10^{16}$ ions/cm$^2$; (v) $10^{16}$-$10^{17}$ ions/cm$^2$; (vi) $10^{17}$-$10^{18}$ ions/cm$^2$; and (vii) $>10^{18}$ ions/cm$^2$.

The surface of the ion source and/or the one or more ionisation chambers and/or the one or more repeller electrodes forming part of the ion source which has been subjected to ion implantation preferably has either:

(a) a resistivity selected from the group consisting of: (i) $<10^{-3}$ Ω-m; (ii) $<10^{-4}$ Ω-m; (iii) $<10^{-5}$ Ω-m; (iv) $<10^{-6}$ Ω-m; (v) $<10^{-7}$ Ω-m; (vi) $10^{-3}$-$10^{-4}$ Ω-m; (vii) $10^{-4}$-$10^{-5}$ Ω-m; (viii) $10^{-5}$-$10^{-6}$ Ω-m; and (ix) $10^{-6}$-$10^{-7}$ Ω-m; and/or (b) a Vickers hardness number or Vickers Pyramid Number (HV) selected from the group consisting of: (i) >1000; (ii) 1000-1100; (iii) 1100-1200; (iv) 1200-1300; (v) 1300-1400; (vi) 1400-1500; (vii) 1500-1600; (viii) 1600-1700; (ix) 1700-1800; (x) 1800-1900; (xi) 1900-2000; (xii) 2000-2100; (xiii) 2100-2200; (xiv) 2200-2300; (xv) 2300-2400; (xvi) 2400-2500; (xvii) 2500-2600; (xviii) 2600-2700; (xix) 2700-2800; (xx) 2800-2900; (xxi) 2900-3000; (xxii) 3000-3100; (xxiii) 3100-3200; (xxiv) 3200-3300; (xv) 3300-3400; (xvi) 3400-3500; and (xvii) >3500, wherein the Vickers hardness number or Vickers Pyramid Number is determined at a load of 30, 40, 50, 60 or 70 kg; and/or (c) a Vickers microhardness selected from the group consisting of: (i) >1000 kg/mm; (ii) 1000-1100 kg/mm; (iii) 1100-1200 kg/mm; (iv) 1200-1300 kg/mm; (v) 1300-1400 kg/mm; (vi) 1400-1500 kg/mm; (vii) 1500-1600 kg/mm; (viii) 1600-1700 kg/mm; (ix) 1700-1800 kg/mm; (x) 1800-1900 kg/mm; (xi) 1900-2000 kg/mm; (xii) 2000-2100 kg/mm; (xiii) 2100-2200 kg/mm; (xiv) 2200-2300 kg/mm; (xv) 2300-2400 kg/mm; (xvi) 2400-2500 kg/mm; (xvii) 2500-2600 kg/mm; (xviii) 2600-2700 kg/mm; (xix) 2700-2800 kg/mm; (xx) 2800-2900 kg/mm; (xxi) 2900-3000 kg/mm; (xxii) 3000-3100 kg/mm; (xxiii) 3100-3200 kg/mm; (xxiv) 3200-3300 kg/mm; (xv) 3300-3400 kg/mm; (xvi) 3400-3500 kg/mm; and (xvii) >3500 kg/mm, and/or (d) a thickness selected from the group consisting of: (i) <1 μm; (ii) 1-2 μm; (iii) 2-3 μm; (iv) 3-4 μm; (v) 4-5 μm; (vi) 5-6 μm; (vii) 6-7 μm; (viii) 7-8 μm; (ix) 8-9 μm; (x) 9-10 μm; (xi) >10 μm; and/or (e) a density selected from the group consisting of: (i) <3.0 g cm$^{-3}$; (ii) 3.0-3.5 g cm$^{-3}$; (iii) 3.5-4.0 g cm$^{-3}$; (iv) 4.0-4.5 g cm$^{-3}$; (v) 4.5-5.0 g cm$^{-3}$; (vi) 5.0-5.5 g cm$^{-3}$; (vii) 5.5-6.0 g cm$^{-3}$; (viii) 6.0-6.5 g cm$^{-3}$; (ix) 6.5-7.0 g cm$^{-3}$; (x) 7.0-7.5 g cm$^{-3}$; (xi) 7.5-8.0 g cm$^{-3}$; (xii) 8.0-8.5 g cm$^{-3}$; (xiii) 8.5-9.0 g cm$^{-3}$; (xiv) 9.0-9.5 g cm$^{-3}$; (xv) 9.5-10.0 g cm$^{-3}$; (xvi) 10.0-10.5 g cm$^{-3}$; (xvii) 10.5-11.0 g cm$^{-3}$; (xviii) 11.0-11.5 g cm$^{-3}$; (xix) 11.5-12.0 g cm$^{-3}$; (xx) 12.0-12.5 g cm$^{-3}$; (xxi) 12.5-13.0 g cm$^{-3}$; (xxii) 13.0-13.5 g cm$^{-3}$; (xxiii) 13.5-14.0 g cm$^{-3}$; (xxiv) 14.0-14.5 g cm$^{-3}$; (xxv) 14.5-15.0 g cm$^{-3}$; (xxvi) 15.0-15.5 g cm$^{-3}$; (xxvii) 15.5-16.0 g cm$^{-3}$; (xxviii) 16.0-16.5 g cm$^{-3}$; (xxix) 16.5-17.0 g cm$^{-3}$; (xxx) 17.0-17.5 g cm$^{-3}$; (xxxi) 17.5-18.0 g cm$^{-3}$; (xxxii) 18.0-18.5 g cm$^{-3}$; (xxxiii) 18.5-19.0 g cm$^{-3}$; (xxxiv) 19.0-19.5 g cm$^{-3}$; (xxxv) 19.5-20.0 g cm$^{-3}$; and (xxxvi) >20.0 g cm$^{-3}$; and/or (f) a coefficient of friction selected from the group consisting of: (i) <0.01; (ii) 0.01-0.02; (iii) 0.02-0.03; (iv) 0.03-0.04; (v) 0.04-0.05; (vi) 0.05-0.06; (vii) 0.06-0.07; (viii) 0.07-0.08; (ix) 0.08-0.09; (x) 0.09-0.10; and (xi) >0.1.

The ion source is preferably selected from the group consisting of: (i) an Electrospray ionisation ("ESI") ion source; (ii) an Atmospheric Pressure Photo Ionisation ("APPI") ion source; (iii) an Atmospheric Pressure Chemical Ionisation ("APCI") ion source; (iv) a Matrix Assisted Laser Desorption Ionisation ("MALDI") ion source; (v) a Laser Desorption Ionisation ("LDI") ion source; (vi) an Atmospheric Pressure Ionisation ("API") ion source; (vii) a Desorption Ionisation on Silicon ("DIOS") ion source; (viii) an Electron Impact ("EI") ion source; (ix) a Chemical Ionisation ("CI") ion source; (x) a Field Ionisation ("FI") ion source; (xi) a Field Desorption ("FD") ion source; (xii) an Inductively Coupled Plasma ("ICP") ion source; (xiii) a Fast Atom Bombardment ("FAB") ion source; (xiv) a Liquid Secondary Ion Mass Spectrometry ("LSIMS") ion source; (xv) a Desorption Electrospray Ionisation ("DESI") ion source; (xvi) a Nickel-63 radioactive ion source; (xvii) an Atmospheric Pressure Matrix Assisted Laser Desorption Ionisation ion source; (xviii) a Thermospray ion source; (xix) an Atmospheric Sampling Glow Discharge Ionisation ("ASGDI") ion source; and (xx) a Glow Discharge ("GD") ion source.

Preferably, the portion of the ion source which has been subjected to ion implantation is selected from the group consisting of: (i) an ion chamber; (ii) a repeller electrode; and (iii) an exit plate or exit aperture arranged at the exit of the ion source through which ions of interest are desired to be transmitted.

According to an aspect of the present invention there is provided a method of mass spectrometry comprising:

ionising ions in an ion source formed from titanium which has been subjected to ion implantation.

According to an aspect of the present invention there is provided a method of making an ion source and/or one or more ionisation chambers and/or one or more repeller electrodes forming part of an ion source for a mass spectrometer comprising:

forming an ion source and/or one or more ionisation chambers and/or one or more repeller electrodes forming part of the ion source of a mass spectrometer from titanium; and subjecting the ion source and/or the one or more ionisation chambers and/or the one or more repeller electrodes forming part of the ion source to ion implantation.

The ion source and/or the one or more ionisation chambers and/or the one or more repeller electrodes forming part of the ion source are preferably subjected to an ion implantation dose selected from the group consisting of: (i) <$10^{13}$ ions/cm$^2$; (ii) $10^{13}$-$10^{14}$ ions/cm$^2$; (iii) $10^{14}$-$10^{15}$ ions/cm$^2$; (iv) $10^{15}$-$10^{16}$ ions/cm$^2$; (v) $10^{16}$-$10^{17}$ ions/cm$^2$; (vi) $10^{17}$-$10^{18}$ ions/cm$^2$; and (vii) >$10^{18}$ ions/cm$^2$.

The method preferably further comprises accelerating ions to be implanted into the ion source and/or the one or more ionisation chambers and/or the one or more repeller electrodes forming part of the ion source to a kinetic energy selected from the group consisting of: (i) <10 keV; (ii) 10-50 keV; (iii) 50-100 keV; (iv) 100-150 keV; (v) 150-200 key; (vi) 200-250 keV; (vii) 250-300 keV; (viii) 300-350 key; (ix) 350-400 key; (x) 400-450 key; (xi) 450-500 keV; and (xii) >500 keV.

According to another aspect of the present invention there is provided a mass spectrometer comprising an ion source formed from a transition metal which has been subjected to ion implantation.

The transition metal is preferably selected from the group consisting of: (i) scandium; (ii) titanium; (iii) vanadium; (iv) chromium; (v) manganese; (vi) iron; (vii) cobalt; (viii) nickel; (ix) copper; (x) zinc; (xi) yttrium; (xii) zirconium; (xiii) niobium; (xiv) molybdenum; (xv) technetium; (xvi) ruthenium; (xvii) rhodium; (xviii) palladium; (xix) silver; (xx) cadmium; (xxi) lanthanum; (xxii) hafnium; (xxiii) tantalum; (xxiv) tungsten; (xxv) rhenium; (xxvi) osmium; (xxvii) iridium; (xxviii) platinum; and (xxix) gold.

According to another aspect of the present invention there is provided a method of mass spectrometry comprising:

ionising ions in an ion source formed from a transition metal which has been subjected to ion implantation.

According to another aspect of the present invention there is provided a method of making an ion source and/or one or more ionisation chambers and/or one or more repeller electrodes forming part of an ion source for a mass spectrometer comprising:

forming an ion source and/or one or more ionisation chambers and/or one or more repeller electrodes forming part of the ion source of a mass spectrometer from a transition metal; and subjecting the ion source and/or the one or more ionisation chambers and/or the one or more repeller electrodes forming part of the ion source to ion implantation.

The transition metal is preferably selected from the group consisting of: (i) scandium; (ii) titanium; (iii) vanadium; (iv) chromium; (v) manganese; (vi) iron; (vii) cobalt; (viii) nickel; (ix) copper; (x) zinc; (xi) yttrium; (xii) zirconium; (xiii) niobium; (xiv) molybdenum; (xv) technetium; (xvi) ruthenium; (xvii) rhodium; (xviii) palladium; (xix) silver; (xx) cadmium; (xxi) lanthanum; (xxii) hafnium; (xxiii) tantalum; (xxiv) tungsten; (xxv) rhenium; (xxvi) osmium; (xxvii) iridium; (xxviii) platinum; and (xxix) gold.

Preferably, the portion of the ion source which has been subjected to ion implantation is selected from the group consisting of: (i) an ion chamber; (ii) a repeller electrode; and (iii) an exit plate or exit aperture arranged at the exit of the ion source through which ions of interest are desired to be transmitted.

The preferred embodiment relates to an EI or CI ion source wherein the ion source comprises titanium which has been subjected to ion implantation in order to passivate the surfaces of the EI or CI source region thereby reducing the surface reactions of molecules prior to ionisation.

Preferably, the portion of the ion source having the first coating or surface is selected from the group consisting of: (i) an ion chamber; (ii) a repeller electrode; and (iii) an exit plate or exit aperture arranged at the exit of the ion source through which ions of interest are desired to be transmitted.

The preferred embodiment relates to an EI or CI ion source wherein the ion source is provided with a surface coating. According to the preferred embodiment surface coatings and surface modification techniques are used to passivate the surfaces contained in an EI or CI source region thereby reducing the surface reactions of molecules prior to ionisation.

Chemical standards were used to investigate the effects of the surface coating. The effects on full scan sensitivity/ionisation were observed.

It is believed that the coated surface of the ion source according to the preferred embodiment reduces adsorption/degradation or decomposition of compounds upon contact with the surface prior to ionisation. Data has been produced to show that the chemical nature of the analyte seems to have a significant effect on the sensitivity. For example, a relatively polar compound (or one containing a polar moity or weak bonds prone to thermal degradation) can be detected with increased sensitivity from a coated volume according to an embodiment, in comparison to a cleaned stainless steel ion source.

The preferred embodiment is particularly advantageous in that a clean conductive (or semi conductive) surface can be provided which is robust to abrasive cleaning and is inert. The surface reduces adsorption, catalysis and degradation/decomposition and hence visual residence time of the chemical within the source environment. The improved ion source also exhibits an increase in apparent sensitivity (compound dependant) and improved sample robustness/reproducibility.

The preferred embodiment is concerned with an improved inert, semi-conductive inorganic metal complex coating on an ion source surface.

In some preferred embodiments, the source volume, trap, repeller and ion exit plate of an ion source are coated with a preferred surface material.

BRIEF DESCRIPTION OF THE DRAWINGS

Various embodiments of the present invention will now be described, by way of example only, and with reference to the accompanying drawings in which:

FIG. 6 shows a comparison of the average intensities, signal-to-noise, noise amplitude and area observed for three compounds with different ion sources; and FIG. 7 shows a comparison of the variations of the intensities, signal-to-noise, noise amplitude and area observed for three compounds for a TiC coated ion source against a cleaned stainless steel ion source.

DETAILED DESCRIPTION

Figure 1:
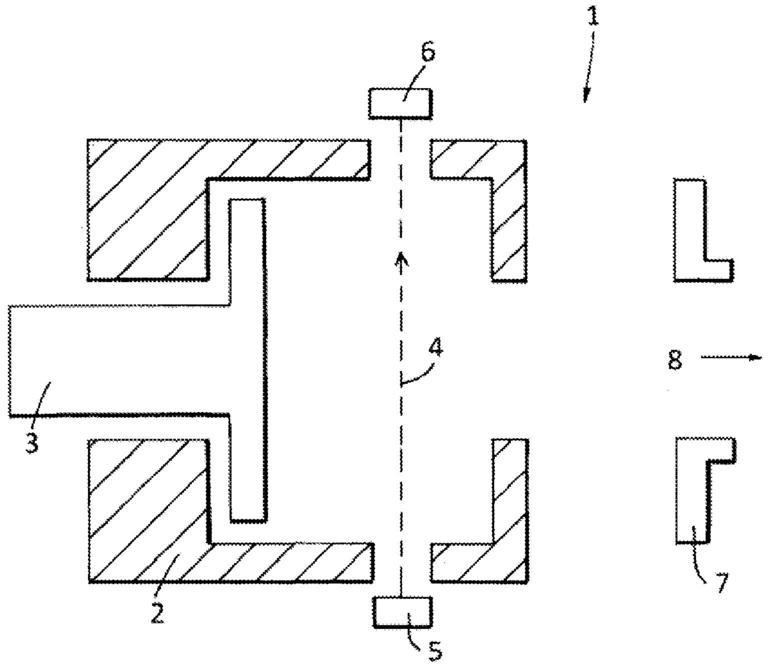
FIG. 1 shows a schematic diagram of an Electron Ionisation ion source according to an embodiment of the present invention.

Some preferred embodiments will now be described. FIG. 1 shows a schematic diagram of an Electron Ionisation ion source 1 comprising a housing 2 forming a chamber and a repeller electrode 3. A neutral analyte gas is introduced from a gas chromatograph into the ion chamber 2. An electron beam 4 is arranged to pass from a heated filament 5 to an electron collector 6. Analyte gas molecules within the ion chamber 2 are preferably caused to interact with the electron beam 4 and as a result the analyte molecules are ionised and form analyte ions. The ionisation process is commonly referred to as being a hard ionisation process in that the analyte molecules fragment during the ionisation process. The resulting analyte fragment ions are repelled from the ion chamber 2 by the repeller electrode 3. The analyte fragment ions may according to an embodiment pass through a lens system 7 before being onwardly transmitted in the direction shown by arrow 8 to subsequent vacuum stages of a mass spectrometer.

Figure 2:
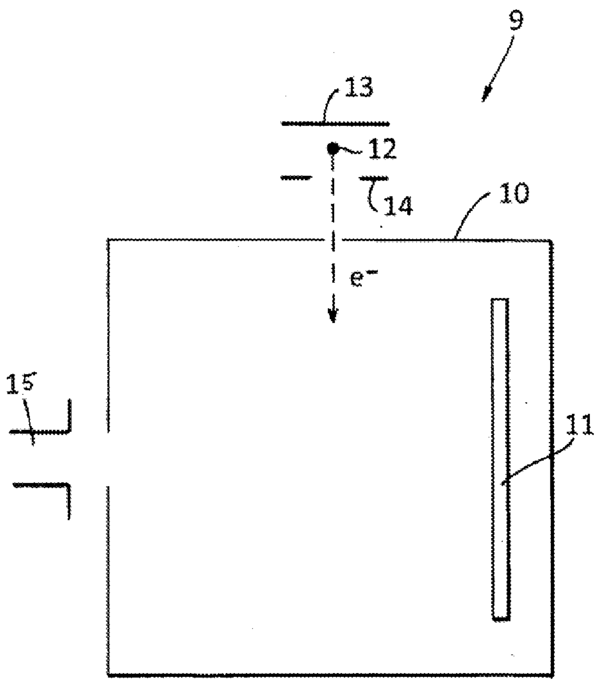
FIG. 2 shows a schematic diagram of an Chemical Ionisation ion source according to an embodiment of the present invention.

FIG. 2 shows a Chemical Ionisation ion source 9 comprising an ion chamber 10 and optional ion repeller 11. A heated filament 12 serves as an electron source and may according to one embodiment be located between an optional repeller plate 13 and an electron lens 14. The electron lens 14 may comprise a plate with a rectangular slot or other shaped aperture aligned with the heated filament 12. Electrons produced by the heated filament 12 are directed into the inside of the ion chamber 10 and preferably collide with neutral reagent gas molecules such as methane and ionise the reagent gas. The resulting reagent ions are then preferably caused to interact with neutral analyte molecules with the result that analyte ions are formed. Analyte ions may be repelled from the chamber 10 by an optional repeller electrode 11 or otherwise extracted from the chamber 10. However, according to a preferred embodiment both the repeller plate 13 and the repeller electrode 11 are omitted. The analyte ions may pass through a lens system 12 prior to being onwardly transmitted to subsequent vacuum stages of a mass spectrometer.

Source surface coatings which were applied to an Electron Ionisation ion source which was operated in an EI+ mode of operation were investigated using a mixture of semi polar GC amenable compounds. The effect on full scan sensitivity was investigated using a gas chromatograph with a tandem mass spectrometer.

The EI ion source which was investigated comprised a source volume, a trap, a repeller and an ion exit plate. These components were all coated with titanium carbide in order to demonstrate the advantages of the preferred embodiment.

The following results relate to data which was obtained from: (i) a standard used stainless steel ion source; (ii) an ion source wherein the ion source chamber and other components were coated with titanium carbide (TiC) according to an embodiment of the present invention; and (iii) a standard cleaned stainless steel ion source.

Figure 3:
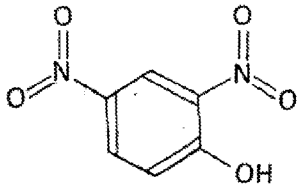
FIG. 3 shows the chemical structure of 2,4 dinitorphenol.
Figure 4:
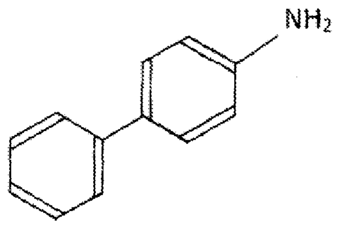
FIG. 4 shows the chemical structure of 4 amino biphenyl.
Figure 5:
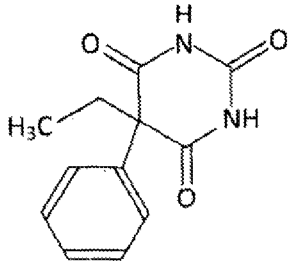
FIG. 5 shows the chemical structure of phenobarbital.

The ion sources were investigated using a mixture of the following compounds: 2,4 dinitrobiphenol, 4 amino biphenyl and phenobarbital. The structures of 2,4 dinitrobiphenol, 4 amino biphenyl and phenobarbital are shown in FIGS. 3-5 respectively.

FIG. 6 shows the ratio increase of the averaged surface coated and cleaned stainless steel ion sources against an uncleaned stainless steel ion source surface for the three compounds. Factor response differences for signal intensity, signal to noise, chemical noise amplitude and peak area are shown.

The TiC coated ion source volume according to an embodiment of the present invention exhibited a signal intensity factor increase of 3.1 for 2,4 dinitrobiphenol compared to the aged stainless steel ion source. Similarly, the TiC coated ion source exhibited a signal intensity factor increase of 1.6 for 4 amino biphenyl and an increase of 2.5 for phenobarbital compared to the aged stainless steel ion source.

The cleaned stainless steel ion source produced an immediate improvement in signal intensity compared to the aged stainless steel ion source for all the analytes by a factor of 1.6 for 2,4 dinitrobiphenol, by a factor of 3.3 for 4 amino-biphenyl and by a factor of 1.3 for phenobarbital.

The signal improvements are greater for the TiC coated ion source according to an embodiment of the present invention but lower than the cleaned stainless steel ion source for 4 amino biphenyl. Of significance is the lower noise amplitude observed for the TiC coated ion source according to an embodiment of the present invention compared to the cleaned stainless steel ion source suggesting possible noise from the cleaning process.

However, the noise amplitude for both the cleaned stainless steel ion source and the TiC coated ion source was higher than the used stainless steel ion source reducing the signal-to-noise (S:N) value while the TiC surface ion source increased the signal more than the noise resulting in an much improved S:N value for all the compounds.

Additionally, the variation for three compounds under investigation of the TiC coated ion source according to an embodiment of the present invention against the cleaned stainless steel ion source are shown in FIG. 7. Within the table format is included the factor response differences for the signal intensity, signal to noise ratio (RMS) chemical noise amplitude and peak area.

An improvement in signal intensity, signal to noise (due to the relative drop in noise) and area counts were observed for both 2,4 dinitrophenol and phenobarbital. These compounds are of a more polar nature and have a potential reactive moiety present on the molecule. The TiC coated ion source provided lower sensitivity in scanning sensitivity for 4-aminobiphenyl compared to the cleaned stainless steel ion source.

Though the above Description refers to a TiC-related example, more generally, some preferred coatings or layers include: 1) metallic carbide, such as TiC; 2) metallic boride; 3) ceramic or DLC, such as SiC; and 4) ion-implanted transition metals, such as ion-implanted titanium.

Although the present invention has been described with reference to the preferred embodiments, it will be understood by those skilled in the art that various changes in form and detail may be made without departing from the scope of the invention as set forth in the accompanying claims.

The invention claimed is:

1. A mass spectrometer comprising an Electron Impact ("EI") or a Chemical Ionisation ("CI") ion source, wherein said ion source comprises a first coating or surface provided on at least a portion of said ion source;

wherein said first coating or surface comprises a metallic carbide coating or surface.

2. A mass spectrometer as claimed in claim 1, wherein said ion source comprises one or more ionisation chambers and said first coating or surface is provided on at least a portion of said one or more ionisation chambers.

3. A mass spectrometer as claimed in claim 1, wherein said ion source further comprises one or more repeller electrodes and said first coating or surface is provided on at least a portion of said one or more repeller electrodes.

4. A mass spectrometer as claimed in claim 1, wherein said ion source or said one or more ionisation chambers or said one or more repeller electrodes forming part of said ion source are made from a material selected from the group consisting of: (i) stainless steel; (ii) a steel alloy comprising $\geqq$11.5% chromium wt. %; (iii) an austenitic stainless steel; (iv) a ferritic stainless steel; (v) an austenitic-ferritic or duplex steel; (vi) titanium; (vii) a titanium alloy; (viii) a nickel-base alloy; (ix) a nickel-chromium alloy; (x) a nickel-chromium alloy comprising $\geqq$50.0% nickel wt. %; and (xi) INCONEL® 600, 625, 690, 702, 718, 939 or X750.

5. A mass spectrometer as claimed in claim 1, wherein said ion source or said one or more ionisation chambers or said one or more repeller electrodes forming part of said ion source comprise stainless steel or an alloy comprising:

(i) 0-0.01 wt. % carbon; (ii) 0.01-0.02 wt. % carbon; (iii) 0.02-0.03 wt. % carbon; (iv) 0.03-0.04 wt. % carbon; (v) 0.04-0.05 wt. % carbon; (vi) 0.05-0.06 wt. % carbon; (vii) 0.06-0.07 wt. % carbon; (viii) 0.07-0.08 wt. % carbon; or (ix) >0.08 wt. % carbon.

6. A mass spectrometer as claimed in claim 1, wherein said ion source or said one or more ionisation chambers or said one or more repeller electrodes forming part of said ion source comprise stainless steel or an alloy comprising:

(i) 0-0.01 wt. % nitrogen; (ii) 0.01-0.02 wt. % nitrogen; (iii) 0.02-0.03 wt. % nitrogen; (iv) 0.03-0.04 wt. % nitrogen; (v) 0.04-0.05 wt. % nitrogen; (vi) 0.05-0.06 wt. % nitrogen; (vii) 0.06-0.07 wt. % nitrogen; or (viii) >0.07 wt. % nitrogen.

7. A mass spectrometer as claimed in claim 1, wherein said ion source or said one or more ionisation chambers or said one or more repeller electrodes forming part of said ion source comprise stainless steel or an alloy comprising:

(i) 0-0.1 wt. % nitrogen; (ii) 0.1-0.2 wt. % nitrogen; (iii) 0.2-0.3 wt. % nitrogen; (iv) 0.3-0.4 wt. % nitrogen; (v) 0.4-0.5 wt. % nitrogen; (vi) 0.5-0.6 wt. % nitrogen; (vii) 0.6-0.7 wt. % nitrogen; or (viii) >0.7 wt. % nitrogen.

8. A mass spectrometer as claimed in claim 1, wherein said ion source or said one or more ionisation chambers or said one or more repeller electrodes forming part of said ion source comprise stainless steel or an alloy comprising:

(i) 12.0-13.0 wt. % chromium; (ii) 13.0-14.0 wt. % chromium; (iii) 14.0-15.0 wt. % chromium; (iv) 15.0-16.0 wt. % chromium; (v) 16.0-17.0 wt. % chromium; (vi) 17.0-18.0 wt. % chromium; (vii) 18.0-19.0 wt. % chromium; (viii) 19.0-20.0 wt. % chromium; (ix) 20.0-21.0 wt. % chromium; (x) 21.0-22.0 wt. % chromium; (xi) 22.0-23.0 wt. % chromium; (xii) 23.0-24.0 wt. % chromium; (xiii) 24.0-25.0 wt. % chromium; (xiv) 25.0-26.0 wt. % chromium; (xv) 26.0-27.0 wt. % chromium; (xvi) 27.0-28.0 wt. % chromium; (xvii) 28.0-29.0 wt. % chromium; (xviii) 29.0-30.0 wt. % chromium; or (xix) >30.0 wt. % chromium.

9. A mass spectrometer as claimed in claim 1, wherein said ion source or said one or more ionisation chambers or said one or more repeller electrodes forming part of said ion source comprise stainless steel or an alloy comprising:

(i) 0-1.0 wt. % nickel; (ii) 1.0-2.0 wt. % nickel; (iii) 2.0-3.0 wt. % nickel; (iv) 3.0-4.0 wt. % nickel; (v) 4.0-5.0 wt. % nickel; (vi) 5.0-6.0 wt. % nickel; (vii) 6.0-7.0 wt. % nickel; (viii) 7.0-8.0 wt. % nickel; (ix) 8.0-9.0 wt. % nickel; (x) 9.0-10.0 wt. % nickel; (xi) 10.0-11.0 wt. % nickel; (xii) 11.0-12.0 wt. % nickel; (xiii) 12.0-13.0 wt. % nickel; (xiv) 13.0-14.0 wt. % nickel; (xv) 14.0-15.0 wt. % nickel; (xvi) 15.0-16.0 wt. % nickel; (xvii) 16.0-17.0 wt. % nickel; (xviii) 17.0-18.0 wt. % nickel; (xix) 18.0-19.0 wt. % nickel; (xx) 19.0-20.0 wt. % nickel; (xxi) 20.0-21.0 wt. % nickel; (xxii) 21.0-22.0 wt. % nickel; (xxiii) 22.0-23.0 wt. % nickel; (xxiv) 23.0-24.0 wt. % nickel; (xxv) 24.0-25.0 wt. % nickel; (xxvi) 25.0-26.0 wt. % nickel; (xxvii) 26.0-27.0 wt. % nickel; (xxviii) 27.0-28.0 wt. % nickel; (xxix) 28.0-29.0 wt. % nickel; (xxx) 29.0-30.0 wt. % nickel; (xxxi) 30.0-31.0 wt. % nickel; (xxxii) 31.0-32.0 wt. % nickel; (xxxiii) 32.0-33.0 wt. % nickel; (xxxiv) 33.0-34.0 wt. % nickel; (xxxv) 34.0-35.0 wt. % nickel; (xxxvi) 35.0-36.0 wt. % nickel; (xxxvii) 36.0-37.0 wt. % nickel; (xxxviii) 37.0-38.0 wt. % nickel; (xxxix) 38.0-39.0 wt. % nickel; (xl) 39.0-40.0 wt. % nickel; (xli) 40.0-41.0 wt. % nickel; (xlii) 41.0-42.0 wt. % nickel; (xliii) 42.0-43.0 wt. % nickel; (xliv) 43.0-44.0 wt. % nickel; (xlv) 44.0-45.0 wt. % nickel; (xlvi) 45.0-46.0 wt. % nickel; or (xlvii) >46.0 wt. % nickel.

10. A mass spectrometer as claimed in claim 1, wherein said ion source or said one or more ionisation chambers or said one or more repeller electrodes forming part of said ion source comprise stainless steel or an alloy comprising:

(i) 0-1.0 wt. % molybdenum; (ii) 1.0-2.0 wt. % molybdenum; (iii) 2.0-3.0 wt. % molybdenum; (iv) 3.0-4.0 wt. % molybdenum; (v) 4.0-5.0 wt. % molybdenum; (vi) 5.0-6.0 wt. % molybdenum; (vii) 6.0-7.0 wt. % molybdenum; (viii) 7.0-8.0 wt. % molybdenum; or (ix) >8.0 wt. % molybdenum.

11. A mass spectrometer as claimed in claim 1, wherein said ion source or said one or more ionisation chambers or said one or more repeller electrodes forming part of said ion source comprise stainless steel or an alloy comprising:

(i) 0-1.0 wt. % copper; (ii) 1.0-2.0 wt. % copper; (iii) 2.0-3.0 wt. % copper; (iv) 3.0-4.0 wt. % copper; or (v) >4.0 wt. % copper.

12. A mass spectrometer as claimed in claim 1, wherein said ion source or said one or more ionisation chambers or said one or more repeller electrodes forming part of said ion source comprise stainless steel or an alloy comprising:

(i) 0.01-1.0 wt. % X; (ii) 1.0-2.0 wt. % X; (iii) 2.0-3.0 wt. % X; (iv) 3.0-4.0 wt. % X; or (v) >4.0 wt. % X;

wherein X comprises cobalt or tantalum or aluminium or titanium or niobium or silicon or manganese or tungsten or phosphorous.

13. A mass spectrometer as claimed in claim 1, wherein said first coating or surface is provided on:

(i) at least 5%, 10%, 15%, 20%, 25%, 30%, 35%, 40%, 45%, 50%, 55%, 60%, 65%, 70%, 75%, 80%, 85%, 90%, 95% or 100% of an inner surface or an outer surface of said ion source; or (ii) at least 5° A), 10%, 15%, 20%, 25%, 30%, 35%, 40%, 45%, 50%, 55%, 60%, 65%, 70%, 75%, 80%, 85%, 90%, 95% or 100% of an inner surface or an outer surface of said one or more ionisation chambers; or (iii) at least 5%, 10%, 15%, 20%, 25%, 30%, 35%, 40%, 45%, 50%, 55%, 60%, 65%, 70%, 75%, 80%, 85%, 90%, 95% or 100% of an inner surface or an outer surface of said one or more repeller electrodes.

14. A mass spectrometer as claimed in claim 1, wherein said first coating or surface is selected from the group consisting of: (i) aluminium carbide or $Al_4C_3$; (ii) chromium carbide, CrC, $Cr_{23}C_6$, $Cr_3C$, $Cr_7C_3$ or $Cr_3C_2$; (iii) copper carbide; (iv) hafnium carbide, HfC or $HfC_{0.99}$; (v) iron carbide, $Fe_3C$, $Fe_7C_3$ or $Fe_2C$; (vi) iridium carbide; (vii) manganese carbide, MnC or $Mn_{23}C_6$; (viii) molybdenum carbide, $Mo_2C$ or $Mo_3C_2$; (ix) nickel carbide or NiC; (x) niobium carbide, NbC, $Nb_2C$, $NbC_{0.99}$, or $Nb_4C_3$; (xi) osmium carbide; (xii) palladium carbide; (xiii) platinum carbide; (xiv) rhenium carbide; (xv) rhodium carbide or RhC; (xvi) ruthenium carbide; (xvii) scandium carbide or ScC; (xviii) tantalum carbide, TaC, $Ta_2C$, $TaC_{0.99}$ or $Ta_4C_3$; (xix) titanium carbide or TiC; (xx) tungsten carbide, WC or $W_2C$; (xxi) vanadium carbide, VC, $VC_{0.97}$, $V_4C_3$; (xxii) yttrium carbide or $YC_2$; (xxiii) zirconium carbide, ZrC or $ZrC_{0.97}$; and (xxiv) silicon carbide or SiC.

15. A mass spectrometer as claimed in claim 1, wherein said first coating or surface comprises: (i) a transition metal carbide; (ii) a carbide alloy; or (iii) a mixed metal carbide alloy.

16. A mass spectrometer as claimed in claim 1, wherein said first coating or surface has either:

(a) a resistivity selected from the group consisting of: (i) $<10^{-3}$ Ω-m; (ii) $<10^{-4}$ Ω-m; (iii) $<10^{-5}$ Ω-m; (iv) $<10^{-6}$ Ω-m; (v) $<10^{-7}$ Ω-m; (vi) $10^{-3}$-$10^{-4}$ Ω-m; (vii) $10^{-4}$-$10^{-5}$ Ω-m; (viii) $10^{-5}$-$10^{-6}$ Ω-m; and (ix) $10^{-6}$-$10^{-7}$ Ω-m; or (b) a Vickers hardness number or Vickers Pyramid Number (HV) selected from the group consisting of: (i) >1000; (ii) 1000-1100; (iii) 1100-1200; (iv) 1200-1300; (v) 1300-1400; (vi) 1400-1500; (vii) 1500-1600; (viii) 1600-1700; (ix) 1700-1800; (x) 1800-1900; (xi) 1900-2000; (xii) 2000-2100; (xiii) 2100-2200; (xiv) 2200-2300; (xv) 2300-2400; (xvi) 2400-2500; (xvii) 2500-2600; (xviii) 2600-2700; (xix) 2700-2800; (xx) 2800-2900; (xxi) 2900-3000; (xxii) 3000-3100; (xxiii) 3100-3200; (xxiv) 3200-3300; (xv) 3300-3400; (xvi) 3400-3500; and (xvii) >3500, wherein said Vickers hardness number or Vickers Pyramid Number is determined at a load of 30, 40, 50, 60 or 70 kg; or (c) a Vickers microhardness selected from the group consisting of: (i) >1000 kg/mm; (ii) 1000-1100 kg/mm; (iii) 1100-1200 kg/mm; (iv) 1200-1300 kg/mm; (v) 1300-1400 kg/mm; (vi) 1400-1500 kg/mm; (vii) 1500-1600 kg/mm; (viii) 1600-1700 kg/mm; (ix) 1700-1800 kg/mm; (x) 1800-1900 kg/mm; (xi) 1900-2000 kg/mm; (xii) 2000-2100 kg/mm; (xiii) 2100-2200 kg/mm; (xiv) 2200-2300 kg/mm; (xv) 2300-2400 kg/mm; (xvi) 2400-2500 kg/mm; (xvii) 2500-2600 kg/mm; (xviii) 2600-2700 kg/mm; (xix) 2700-2800 kg/mm; (xx) 2800-2900 kg/mm; (xxi) 2900-3000 kg/mm; (xxii) 3000-3100 kg/mm; (xxiii) 3100-3200 kg/mm; (xxiv) 3200-3300 kg/mm; (xv) 3300-3400 kg/mm; (xvi) 3400-3500 kg/mm; and (xvii) >3500 kg/mm, or (d) a thickness selected from the group consisting of: (i) <1 μm; (ii) 1-2 μm; (iii) 2-3 μm; (iv) 3-4 μm; (v) 4-5 μm; (vi) 5-6 μm; (vii) 6-7 μm; (viii) 7-8 μm; (ix) 8-9 μm; (x) 9-10 μm; and (xi) >10 μm; or (e) a density selected from the group consisting of: (i) <3.0 g $cm^{-3}$; (ii) 3.0-3.5 g $cm^{-3}$; (iii) 3.5-4.0 g $cm^{-3}$; (iv) 4.0-4.5 g $cm^{-3}$; (v) 4.5-5.0 g $cm^{-3}$; (vi) 5.0-5.5 g $cm^{-3}$; (vii) 5.5-6.0 g $cm^{-3}$; (viii) 6.0-6.5 g $cm^{-3}$; (ix) 6.5-7.0 g $cm^{-3}$; (x) 7.0-7.5 g $cm^{-3}$; (xi) 7.5-8.0 g $cm^{-3}$; (xii) 8.0-8.5 g $cm^{-3}$; (xiii) 8.5-9.0 g $cm^{-3}$; (xiv) 9.0-9.5 g $cm^{-3}$; (xv) 9.5-10.0 g $cm^{-3}$; (xvi) 10.0-10.5 g $cm^{-3}$; (xvii) 10.5-11.0 g $cm^{-3}$; (xviii) 11.0-11.5 g $cm^{-3}$; (xix) 11.5-12.0 g $cm^{-3}$; (xx) 12.0-12.5 g $cm^{-3}$; (xxi) 12.5-13.0 g $cm^{-3}$; (xxii) 13.0-13.5 g $cm^{-3}$; (xxiii) 13.5-14.0 g $cm^{-3}$; (xxiv) 14.0-14.5 g $cm^{-3}$; (xxv) 14.5-15.0 g $cm^{-3}$; (xxvi) 15.0-15.5 g $cm^{-3}$; (xxvii) 15.5-16.0 g $cm^{-3}$; (xxviii) 16.0-16.5 g $cm^{-3}$; (xxix) 16.5-17.0 g $cm^{-3}$; (xxx) 17.0-17.5 g $cm^{-3}$; (xxxi) 17.5-18.0 g $cm^{-3}$; (xxxii) 18.0-18.5 g $cm^{-3}$; (xxxiii) 18.5-19.0 g $cm^{-3}$; (xxxiv) 19.0-19.5 g $cm^{-3}$; (xxxv) 19.5-20.0 g $cm^{-3}$; and (xxxvi) >20.0 g $cm^{-3}$; or (f) a coefficient of friction selected from the group consisting of: (i) <0.01; (ii) 0.01-0.02; (iii) 0.02-0.03; (iv) 0.03-0.04; (v) 0.04-0.05; (vi) 0.05-0.06; (vii) 0.06-0.07; (viii) 0.07-0.08; (ix) 0.08-0.09; (x) 0.09-0.10; and (xi) >0.1.

17. A mass spectrometer as claimed in claim 1, wherein said portion of said ion source having said first coating or surface is selected from the group consisting of: (i) an ion chamber; (ii) a repeller electrode; and (iii) an exit plate or exit aperture arranged at the exit of said ion source through which ions of interest are desired to be transmitted.

18. A method of mass spectrometry comprising:

ionising ions in an Electron Impact ("EI") or a Chemical Ionisation ("CI") ion source having a first coating or surface provided on at least a portion of said ion source;

wherein said first coating or surface comprises a metallic carbide coating or surface.

19. A method of making an ion source or one or more ionisation chambers or one or more repeller electrodes forming part of an Electron Impact ("EI") or a Chemical Ionisation ("CI") ion source for a mass spectrometer comprising:

depositing, sputtering or forming a first coating or surface on at least a portion of an ion source or one or more ionisation chambers or one or more repeller electrodes forming part of said ion source;

wherein said first coating or surface comprises a metallic carbide coating or surface.

20. A method as claimed in claim 19, wherein said step of depositing, sputtering or forming said first coating or surface comprises using a method selected from the group consisting of: (i) magnetron sputtering; (ii) closed field unbalanced magnetron sputter on plating; (iii) electroplating; (iv) thermal spray coating; (v) vapour deposition; (vi) Chemical Vapour Deposition ("CVD"); (vii) combustion torch/flame spraying; (viii) electric arc spraying; (ix) plasma spraying; (x) ion plating; (xi) ion implantation; (xii) sputtering; (xiii) sputter deposition; (xiv) laser surface alloying; (xv) Physical Vapour Deposition ("PVD"); (xvi) plasma-based ion plating; (xvii) gas plasma discharge sputtering; (xviii) laser cladding; (xix) plasma enhanced Chemical Vapour Deposition; (xx) low pressure Chemical Vapour Deposition; (xxi) laser enhanced Chemical Vapour Deposition; (xxii) active reactive evaporation; (xxiii) Pulsed Laser Deposition ("PLD"); (xxiv) RF-sputtering; (xxv) Ion-Beam Sputtering ("IBS"); (xxvi) reactive sputtering; (xxvii) Ion-Assisted Deposition ("IAD"); (xxviii) high target utilisation sputtering; (xxix) High Power Impulse Magnetron Sputtering ("HIPIMS"); and (xxx) DC-sputtering.

21. A method as claimed in claim 18, wherein said first coating or surface is selected from the group consisting of: (i) aluminium carbide or $Al_4C_3$; (ii) chromium carbide, CrC, $Cr_{23}C_6$, $Cr_3C$, $Cr_7C_3$ or $Cr_3C_2$; (iii) copper carbide; (iv) hafnium carbide, HfC or $HfC_{0.99}$; (v) iron carbide, $Fe_3C$, $Fe_7C_3$ or $Fe_2C$; (vi) iridium carbide; (vii) manganese carbide, MnC or $Mn_{23}C_6$; (viii) molybdenum carbide, $Mo_2C$ or $Mo_3C_2$; (ix) nickel carbide or NiC; (x) niobium carbide, NbC, $Nb_2C$, $NbC_{0.99}$, or $Nb_4C_3$; (xi) osmium carbide; (xii) palladium carbide; (xiii) platinum carbide; (xiv) rhenium carbide; (xv) rhodium carbide or RhC; (xvi) ruthenium carbide; (xvii) scandium carbide or ScC; (xviii) tantalum carbide, TaC, $Ta_2C$, $TaC_{0.99}$ or $Ta_4C_3$; (xix) titanium carbide or TiC; (xx) tungsten carbide, WC or $W_2C$; (xxi) vanadium carbide, VC, $VC_{0.97}$, $V_4C_3$; (xxii) yttrium carbide or $YC_2$; (xxiii) zirconium carbide, ZrC or $ZrC_{0.97}$, and (xxiv) silicon carbide or SiC.

22. A method as claimed in claim 18, wherein said portion of said ion source having said first coating or surface is selected from the group consisting of: (i) an ion chamber; (ii) a repeller electrode; and (iii) an exit plate or exit aperture arranged at the exit of said ion source through which ions of interest are desired to be transmitted.

* * * * *